United States Patent [19]
Inaba et al.

[11] Patent Number: 5,931,725
[45] Date of Patent: Aug. 3, 1999

[54] WAFER POLISHING MACHINE

[75] Inventors: Takao Inaba; Masaaki Oguri; Kenji Sakai; Minoru Numoto; Hisashi Terashita, all of Mitaka, Japan

[73] Assignee: Tokyo Seimitsu Co., Ltd., Tokyo, Japan

[21] Appl. No.: 08/899,759

[22] Filed: Jul. 24, 1997

[30] Foreign Application Priority Data

Jul. 30, 1996 [JP] Japan ................................. 8-200620
Apr. 4, 1997 [JP] Japan ................................. 9-086970

[51] Int. Cl.[6] ........................................................ B24B 7/22
[52] U.S. Cl. ........................ 451/288; 451/446; 451/398; 451/443
[58] Field of Search ..................................... 451/288, 287, 451/289, 290, 443, 444, 446, 41, 398, 60, 488, 285

[56] References Cited

U.S. PATENT DOCUMENTS

| 5,205,082 | 4/1993 | Shendon et al. | |
|---|---|---|---|
| 5,527,209 | 6/1996 | Volodarsky et al. | |
| 5,584,751 | 12/1996 | Kobayashi et al. | 451/288 |
| 5,643,061 | 7/1997 | Jackson et al. | 451/288 |
| 5,681,215 | 10/1997 | Sherwood et al. | 451/288 |
| 5,695,392 | 12/1997 | Kim | 451/288 |

FOREIGN PATENT DOCUMENTS

| 3283859 | 11/1988 | Japan | 451/288 |
|---|---|---|---|
| 2 302 830 | 2/1997 | United Kingdom . | |

*Primary Examiner*—Robert A. Rose
*Attorney, Agent, or Firm*—Sixbey, Friedman, Leedom & Ferguson; David S. Safran

[57] ABSTRACT

A semiconductor wafer is held by a wafer mount plate, which is loosely inserted into a housing. An air chamber is formed between the wafer mount plate and the housing. A retainer ring encloses the semiconductor wafer, and the semiconductor wafer as well as the retainer ring contacts with a polishing pad. An roughness is formed at the bottom of the retainer ring so as to dress the polishing pad. Polishing liquid is supplied to the inside of the retainer ring. Thus, the polishing pressure can be uniformly applied and the polishing liquid can be uniformly supplied on the whole surface of the semiconductor wafer, and the polishing for the semiconductor wafer and the dressing for the polishing pad can be performed at the same time.

5 Claims, 7 Drawing Sheets

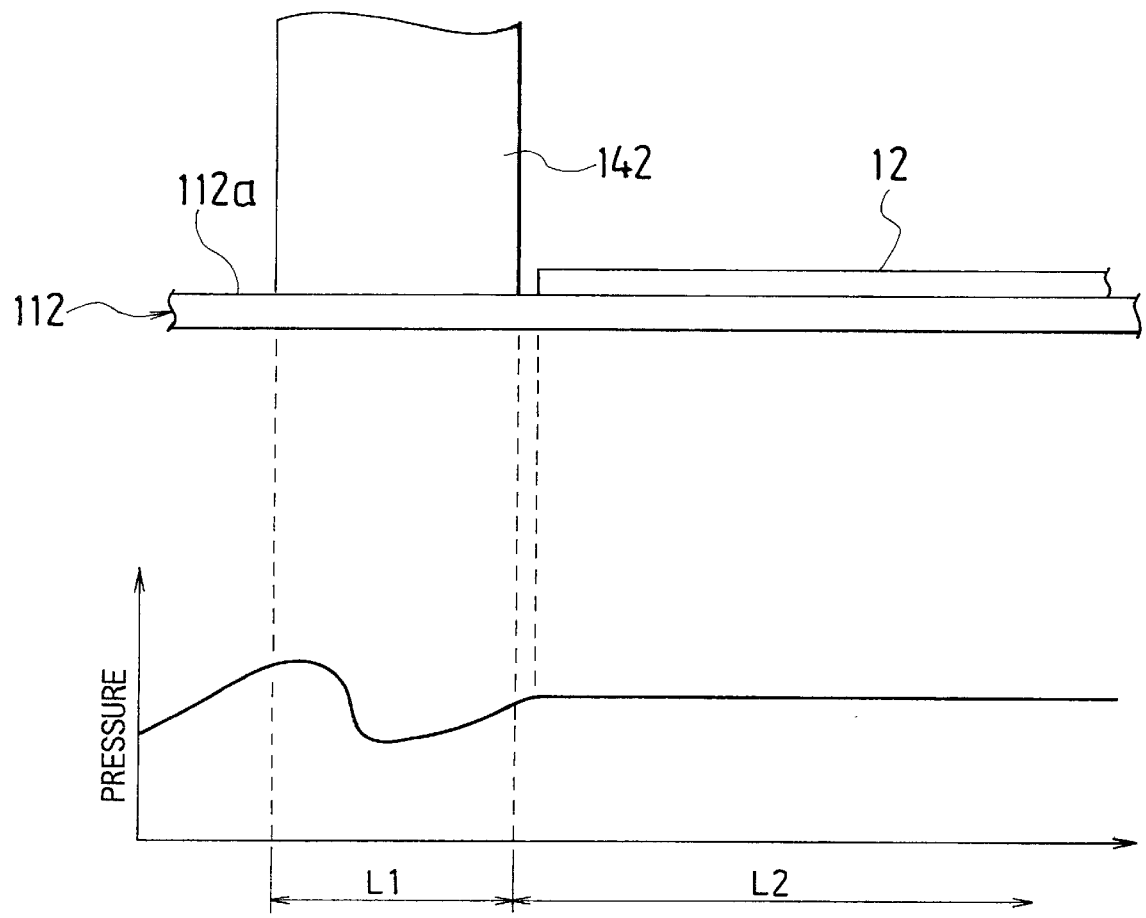

WAFER POLISHING MACHINE

BACKGROUND OF THE INVENTION

1. Field of the Invention

The present invention relates generally to a polishing machine for polishing a wafer, and more particularly to a polishing machine which is able to uniformly polish the whole surface of the semiconductor wafer.

2. Description of Related Art

As semiconductor devices have recently become larger scale and consisted of multiple layers, it has become more important to accurately plane a semiconductor wafer in the process of manufacturing the semiconductor devices. To plane the semiconductor wafer, polishing liquid is supplied to an area between the semiconductor wafer and a polishing pad, and the semiconductor wafer and the polishing pad are moved relatively to each other and pressed against each other so that the semiconductor wafer can be polished.

In order to accurately polish the semiconductor wafer, the semiconductor wafer and the polishing pad must be maintained precisely parallel, and further, a pressure between the semiconductor wafer and the polishing pad (hereinafter referred to as a polishing pressure) must be uniformly applied to the whole surface of the semiconductor wafer.

In the conventional semiconductor wafer polishing machine, only the semiconductor wafer is pressed against the polishing pad so that the semiconductor wafer can be polished, and hence an elastic stress of the polishing pad concentrates on the edge of the semiconductor wafer. That is, the polishing pressure concentrates on the edge of the semiconductor wafer, and thereby only the edge of the semiconductor wafer is excessively polished. In addition, the semiconductor wafer sinks in the surface of the polishing pad, and the semiconductor wafer and the polishing pad are inclined relatively to each other as a result. Consequently, the semiconductor wafer cannot be uniformly polished.

On the other hand, in order to uniformly polish the wafer, the polishing liquid is preferred to be uniformly distributed over the area between the semiconductor wafer and the polishing pad. In the conventional machine, the polishing liquid is dropped on the surface of the polishing pad so that the polishing liquid can infiltrate the area between the semiconductor wafer and the polishing pad. The dropped polishing liquid infiltrates some extent at the periphery of the semiconductor wafer; however, the polishing liquid cannot easily infiltrate the center of the semiconductor wafer. Hence, there is a difference in the quantity of the supplied polishing liquid between the center of the semiconductor wafer and the periphery thereof, and the semiconductor wafer cannot be uniformly polished.

Moreover, the polishing pad is generally made of porous material so as to hold the dropped polishing liquid. If pores on the surface of the polishing pad are clogged up with polish-dust and abrasive grains in the polishing liquid, the polishing efficiency will be lowered considerably. Accordingly, the dressing must be performed at regular intervals so as to remove the polish-dust and abrasive grains which clog up the pores.

In the conventional machine, the polishing stops every time the dressing starts, and the throughput cannot be improved as a result. Further, special equipment is required to perform the dressing.

SUMMARY OF THE INVENTION

The present invention has been developed in view of the above-described circumstances, and has its object the provision of a wafer polishing machine which is able to apply polishing pressure and polishing liquid to the whole surface of the wafer uniformly, and which is able to perform polishing of the wafer and dressing of the polishing body at the same time.

In order to achieve the above-mentioned object, the wafer polishing machine according to the present invention, comprises: a wafer holding member for holding a wafer; a wafer holding member rotating means for rotating the wafer holding member; a polishing body; a polishing body rotating means for rotating the polishing body; a pressing means for pressing the wafer against the polishing body; a retainer ring attached to the wafer holding member to enclose the wafer, the retainer ring as well as the wafer contacting with the polishing body, a polishing liquid adjustment groove being formed from inside to outside on a face of the retainer ring, the face contacting with the polishing body; and a polishing liquid supply means for supplying polishing liquid to the inside of the retainer ring.

In the wafer polishing machine of the present invention, the wafer is enclosed by the retainer ring, which comes in contact with the polishing body together with the wafer, so that the stress from the polishing body can be prevented from concentrating on the edge of the wafer and the polishing pressure can be uniformly applied to the whole surface of the wafer.

Moreover, in the present invention, since the polishing liquid is supplied to the inside of the retainer ring, the polishing liquid easily infiltrates the center of the wafer without such a problem that the polishing liquid uselessly spills to the outside. Thus, the polishing liquid can be uniformly supplied to the whole surface of the wafer.

Further, in the present invention, a polishing liquid adjustment groove is formed on a face of the retainer ring which comes in contact with the polishing body. The polishing liquid which finished polishing is discharged to the outside via the polishing liquid adjustment groove.

Furthermore, in the present invention, the surface of the polishing body is rubbed with the retainer ring during the polishing operation, and is washed with the polishing liquid. Thus, the polishing operation for the wafer and the dressing operation for the polishing body can be performed at the same time.

According to the invention of claim 2, the face of the retainer ring is knurled so as to effectively dress the polishing body, so that the dressing effect can be improved.

According to the invention of claim 3, the retainer ring is attached to a housing, which holding a wafer mount plate holding the wafer, and a pressure chamber is arranged between the housing and the wafer mount plate. Thus, by regulating the internal pressure of the pressure chamber, the relative positions of the wafer and the retainer ring can be easily controlled.

According to the invention of claim 4, the face of the retainer ring is knurled so as to effectively dress the polishing body, so that the dressing effect can be improved.

According to the invention of claim 5, there is provided the retainer ring, and the retainer ring as well as the wafer comes in contact with the polishing body. Thus, the pressure, which is applied to the wafer by the polishing body, can be made uniform by the retainer ring, and thereby the wafer can be uniformly polished. Moreover, the retainer ring prevents the polishing body from swelling up at the edge of the wafer.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 7 is a view of assistance in explaining a pressure which is applied to the wafer by the polishing body.

DETAILED DESCRIPTION OF THE PREFERRED EMBODIMENTS

This invention will be described in further detail by way of example with reference to the accompanying drawings.

Figure 1:
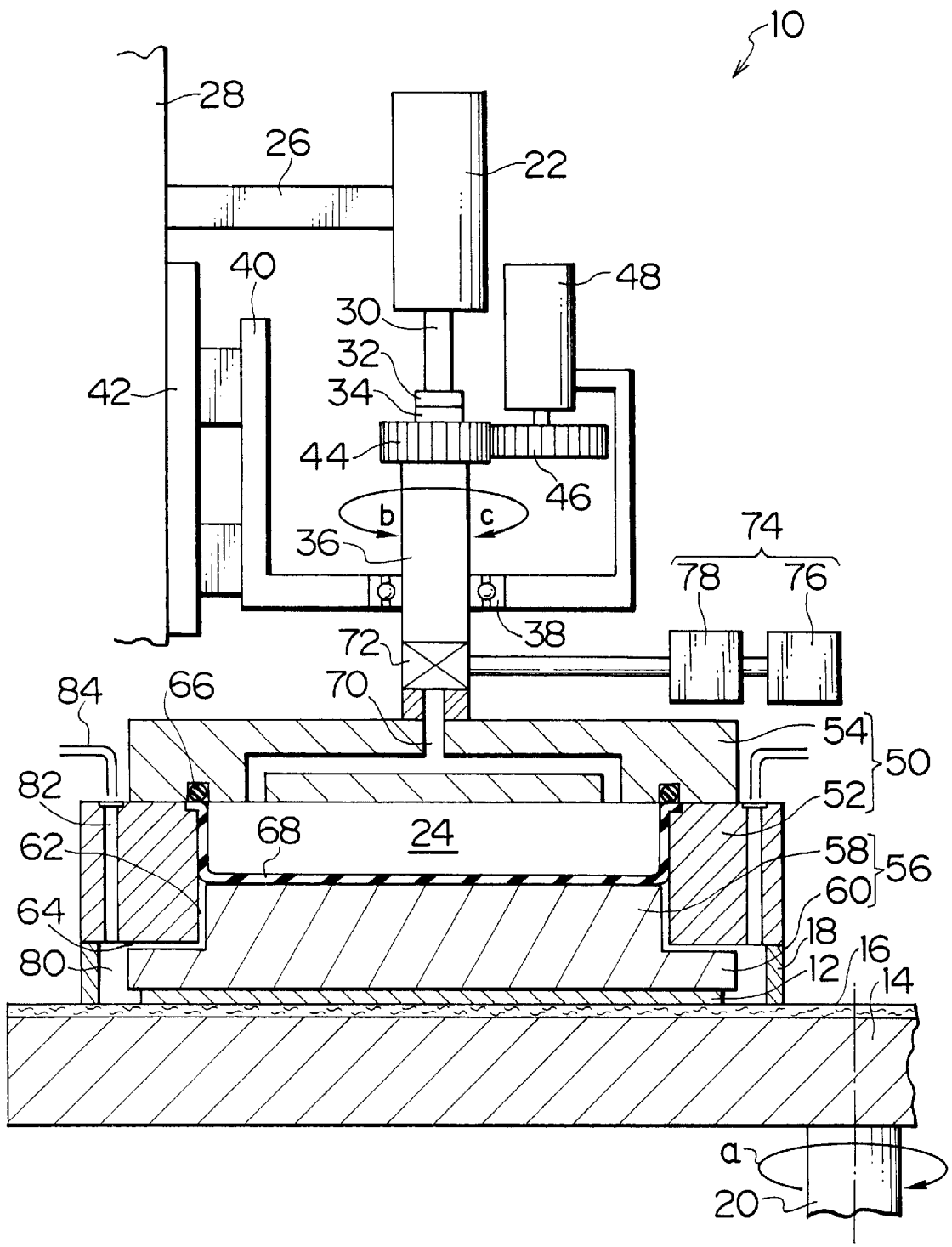
FIG. 1 is a sectional view illustrating the construction of essential parts of the first embodiment for a polishing machine according to the present invention.

FIG. 1 is a sectional view illustrating the essential parts of a polishing machine 10 according to the first embodiment for the present invention. In the polishing machine 10, a semiconductor wafer 12 is pressed against a polishing pad 16 on a turn table 14. The polishing machine 10 is provided with a retainer ring 18, which encloses the semiconductor wafer 12.

The turn table 14 is turned about a rotating shaft 20 of a driving is gear (not shown) at a predetermined speed in the direction of an arrow (a) in FIG. 1. The polishing pad 16 is glued on the turn table 14. The turn table 14, the polishing pad 16 and the rotating shaft 20 of the driving gear compose a polishing part. In this embodiment, the construction of the polishing machine 10 except for the polishing part will be generally referred to as a holding and pressing part.

The semiconductor wafer 12 is polished in a state of being pressed against the polishing pad 16 by a vertical feed device 22 and an air chamber 24.

The vertical feed device 22 is attached to a column 28 via an arm 26. A rod 30 of the vertical feed device 22 is vertically moved by a feed mechanism, which is composed of a feed screw and a motor (not shown) inside the vertical feed device 22. A rotating shaft 36 is fixed to the bottom end of the rod 30 via a load cell 32 and a coupling 34. The rotating shaft 36 is pivotally supported by a base 40 via a bearing 38. The base 40 is supported by the column 28 via a guide 42 and a linear bearing (not shown) in such a manner that the base 40 can be movable in vertical directions. Hence, the rotating shaft 36 is vertically moved by the vertical feed device 22.

The rotating shaft 36 connects to a spindle of a motor 48, which is attached to the base 40, via gears 44, 46, and the rotating shaft 36 is rotated by the motor 48 in the direction of arrows b and c in FIG. 1 in such a manner that the rotational speed is adjustable.

A housing 50 is attached to the bottom end of the rotating shaft 36, and the housing 50 supports a wafer mount plate 56 at a position opposite to the turn table 14. The housing 50 consists of a guide ring 52 and a disk base plate 54, and the wafer mount plate 56 consists of a columnar part 58 and a disk part 60. The bottom side of the disk part 60 holds the semiconductor wafer 12 by suitable holding means such as a vacuum chuck (not shown). On the other hand, the columnar part 58 is inserted into the guide ring 52, and a clearance 62 is formed between the outer peripheral surface of the columnar part 58 and the inner peripheral surface of the guide ring 52. A clearance 64 is formed between the top side of the disk part 60 and the bottom side of the guide ring 52.

The wafer mount plate 56 is movable, with respect to the housing 50, in vertical directions within the clearance 64 and in horizontal directions within the clearance 62, and it is also swingable. That is, the wafer mount plate 56 does not directly receive pressure from the housing 50. Further, the columnar part 58 is anchored at the guide ring 52 by a falling prevention pin (not shown), so that the wafer mount plate 56 moves in accordance with the rotation and vertical movement of the housing 50 and is prevented from falling.

The circumferential edge of elastic film 68 is pinched between the base plate 54 and the guide ring 52 via an O-ring 66. The air chamber 24 as a pressure chamber is formed between the top side of the elastic film 68 and the bottom side of the base plate 54, and the air chamber 24 is sealed by the O-ring 66. An air supply passage 70, which communicates with the air chamber 24, is formed at the inside of the base plate 54 and the rotating shaft 36. The air supply passage 70 connects to an external pressure regulator 74 via a rotary joint 72, which is provided within the rotating shaft 36. The pressure regulator 74 consists of an air pump 76 and an air regulator 78, which supply the air of a desired pressure to the air chamber 24.

The pressure regulator 74 supplies the air to the air chamber 24, so that the bottom side of the elastic film 68 comes into contact with the top side of the columnar part 58, and the pressure is applied to the wafer mount plate 56 downward in the drawing. The pressure is directly transmitted to the semiconductor wafer 12 to become the polishing pressure.

As stated above, by applying the pressure to the wafer mount plate 56 via the air chamber 22, the top side of the wafer mount plate 56 is uniformly pressured, so that the semiconductor wafer 12 and the polishing pad 16 can be prevented from tilting relatively to one another. Thus, the polishing pressure can be uniformly applied to the whole surface of the semiconductor wafer 12.

The retainer ring 18 is attached to the bottom side of the guide ring 52, and the retainer ring 18 encloses the semiconductor wafer 12. The retainer ring 18 as well as the semiconductor wafer 12 are pressed against the polishing pad 16.

Since the retainer ring 18 encloses and protects the edge of the semiconductor wafer 12, the elastic stress of the polishing pad 16 can be prevented from concentrating on the edge of the semiconductor wafer 12, and the polishing pressure can be uniform. In addition, the retainer ring 18 can prevent the semiconductor wafer 12 from sinking in the polishing pad 16, and thereby the edge of the semiconductor wafer 12 is prevented from being excessively polished. Moreover, the semiconductor wafer 12 and the polishing pad 16 can be prevented from tilting relatively to one another, and thus the polishing pressure can be uniform. Thereby, the whole surface of the semiconductor wafer 12 can be uniformly polished.

A clearance 80 is formed between the inner peripheral surface of the retainer ring 18 and the outer peripheral surface of the disk part 60. Four polishing liquid passages 82 are formed at regular intervals in the guide ring 52, and the top side of the guide ring 52 communicates with the clearance 80 via the polishing liquid passages 82. The polishing liquid (not shown) is dropped from external polishing liquid supply pipes 84, and the polishing liquid is supplied to the area between the semiconductor wafer 12 and the polishing pad 16 via the polishing liquid passages 82 and the clearance 80. A polishing liquid supply mechanism is composed of the guide ring 52, which has the polishing liquid passages 82, the polishing liquid supply pipes 84, and a polishing liquid compressor (not shown), which compresses the polishing liquid and sends it to the polishing liquid supply pipes 84.

Figure 2:
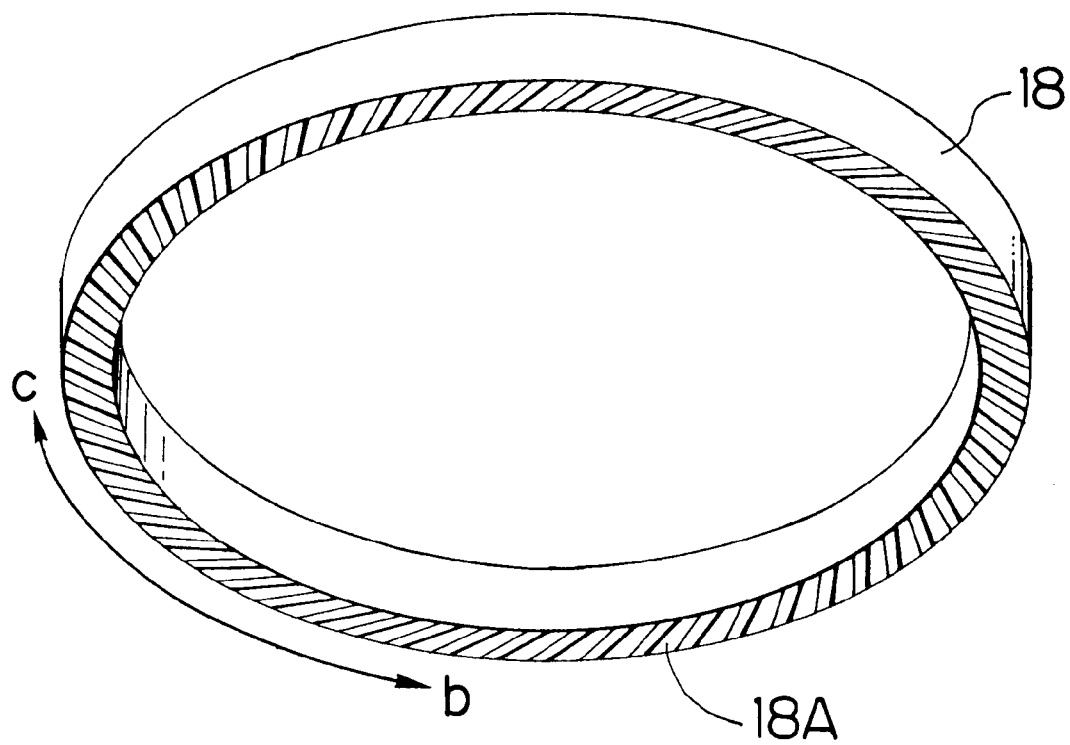
FIG. 2 is a perspective view illustrating the bottom of a retainer ring in FIG. 1.
Figure 3:
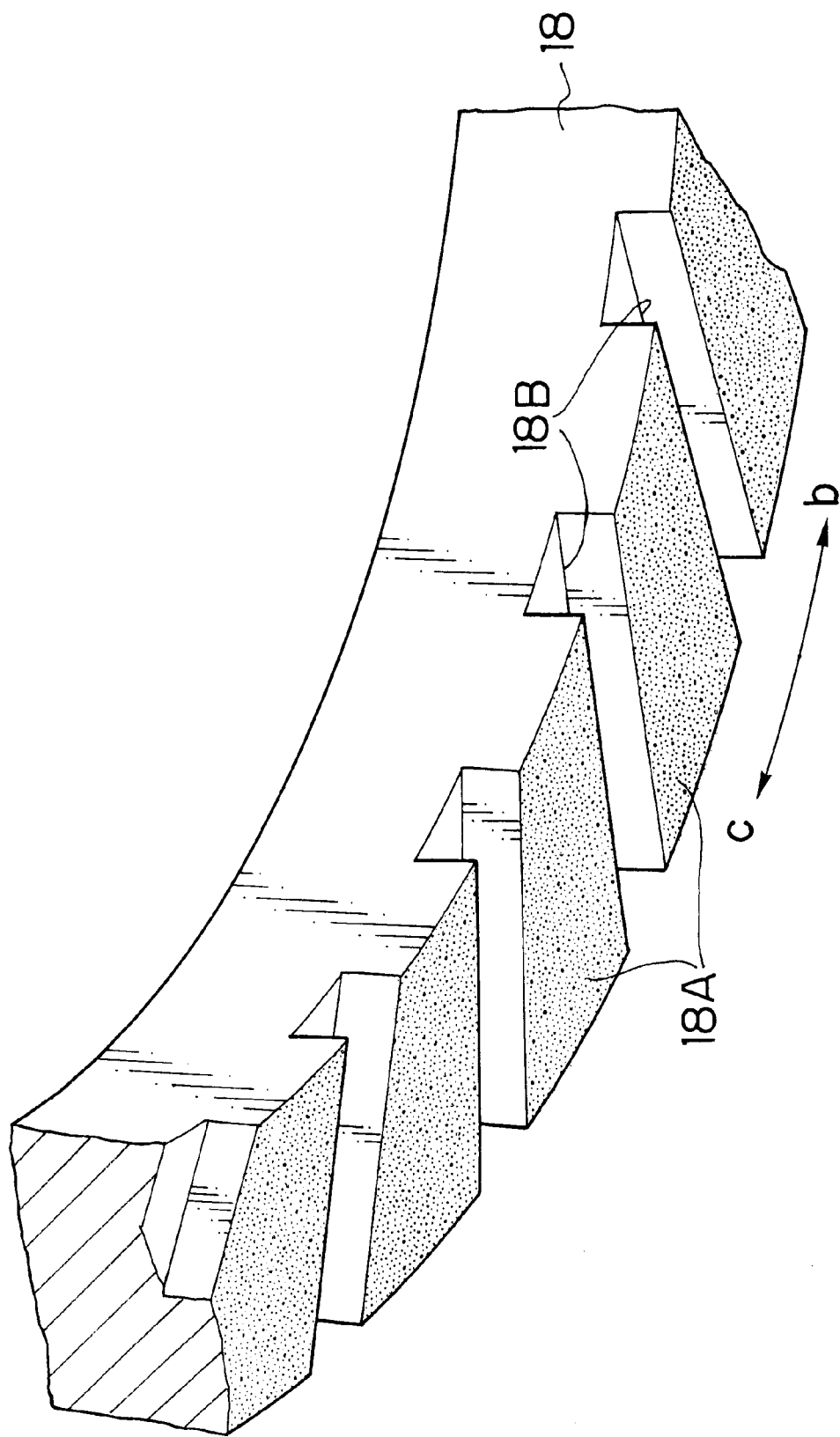
FIG. 3 is a partially enlarged view of FIG. 2.

FIG. 2 is a perspective view illustrating the bottom side of the retainer ring 18, and FIG. 3 is a partially-enlarged view thereof. The retainer ring 18 is rotated in the directions of the arrows b and c.

Polishing liquid adjustment grooves 18B are formed at the bottom face of the retainer ring 18, and the inside of the retainer ring 18 communicates with the outside thereof through the polishing liquid adjustment grooves 18B. The polishing liquid adjustment grooves 18B are formed diagonally with respect to radial directions of the retainer ring 18 so that the polishing liquid can be drawn from the inside of the retainer ring 18 (the semiconductor wafer's side in FIG. 1) to the outside of the retainer ring 18 when the retainer ring 18 is rotated in the predetermined rotating direction (the direction of the arrow b). When the retainer ring 18 is rotated in the reverse direction to the predetermined rotating direction (the direction of the arrow c), the polishing liquid is drawn from the outside of the retainer ring 18 to the inside of the retainer ring 18. Thereby, the polishing liquid supplied to the semiconductor wafer 12 can be prevented from running short, or the polishing liquid can be easily discharged from the semiconductor wafer 12. At the same time, the polish-dust and abrasive grains which clog up the pores on the polishing pad 16 can be removed with the edges of the polishing liquid adjustment grooves 18B, and the polishing liquid on the polishing pad 16 can be stirred to be uniform.

As shown in FIG. 3, a contact surface 18A, which is the bottom face of the retainer ring 18 and comes in contact with the polishing pad 16, is knurled so as to effectively scrape the polishing pad 16 clean. The roughness on the contact surface 18A is effective in the scraping off the polish-dust and abrasive grains which clog up the pores on the polishing pad 16 and in the stirring of the polishing liquid on the polishing pad 16, so that the dressing effect can be improved.

Next, an explanation will be given about the method of polishing the semiconductor wafer 12 with the polishing machine 10 of FIG. 1, which is constructed in the above-mentioned manner.

First, the semiconductor wafer 12 is mounted on the wafer mount plate 56 with that a face to be polished is placed face down. Next, the vertical feed device 22 is activated to make the retainer ring 18 come into contact with the polishing pad 16, and the pressure regulator 74 is activated to pressurize the air chamber 24 so as to press the semiconductor wafer 12 against the polishing pad 16 with a predetermined polishing pressure. Then, the semiconductor wafer 12 and the polishing pad 16 are rotated while the polishing liquid is supplied on the polishing pad 16 from the polishing liquid supply pipes 84 via the polishing liquid passages 82 and the clearance 80. Thereby, the semiconductor wafer 12 is polished.

In this case, the stress which the semiconductor wafer 12 receives from the polishing pad 16 can be calculated from the polishing pressure which is regulated by the pressure regulator 74. The total stress applied to the housing 50, which the semiconductor wafer 12 and the retainer ring 18 receive from the polishing pad 16, can be measured with the load cell 32.

Consequently, by controlling the vertical feed device 22 and the pressure regulator 74, the polishing pressure applied onto the semiconductor wafer 12 can be regulated.

While the sum of the stress measured by the load cell 32 is controlled, the vertical feed device 22 and the pressure regulator 74 may be controlled to change the capacity of the air chamber 24 without changing the internal pressure thereof. Thereby, the relative positions of the semiconductor wafer 12 and the retainer ring 18 can be easily regulated while a desired polishing pressure is applied onto the semiconductor wafer 12. Thus, by regulating the relative positions of the semiconductor wafer 12 and the retainer ring 18, the pressure of the retainer ring 18 against the surface of the polishing pad 16 can be variable according to the desired polishing pressure. That is, even if the polishing pressure is changed, a small swell on the surface of the polishing pad 16 can be maintained at the edge of the semiconductor wafer 12.

That is, the vertical feed device 22, the housing 50, the elastic film 68 and the pressure regulator 74 serve as a pressure regulator for regulating the pressure of the retainer ring 18 against the surface of the polishing pad 16 according to the desired polishing pressure.

Figure 4:
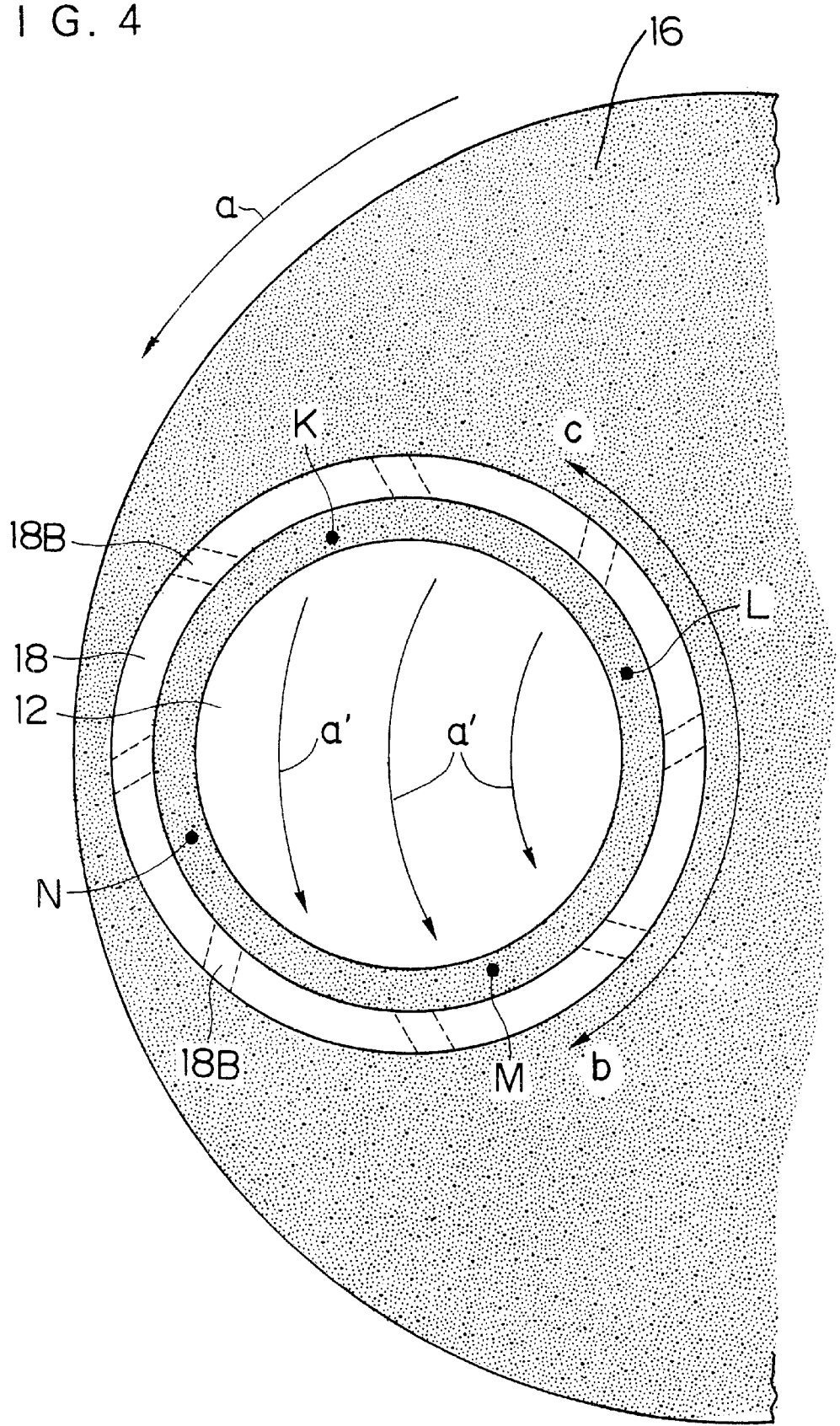
FIG. 4 is a view conceptionally describing the flow of polishing liquid.

FIG. 4 is a view conceptionally describing the flow of the polishing liquid during the polishing, in which the polishing pad 16, the semiconductor wafer 12 and the retainer ring 18 are viewed from above. The polishing pad 16 rotates in the direction of the arrow a, and it moves below the semiconductor wafer 12 in the direction of arrows a', and the semiconductor wafer 12 and the retainer ring 18 are integrally rotated in the direction of the arrow c (they may be rotated in the direction of the arrow b if the polishing liquid is excessive during the polishing).

Marks K, L, M and N indicate positions where the polishing liquid is dropped from the polishing liquid passages 82 of the guide ring 52 in FIG. 1 (the positions are changed according to the rotation of the guide ring 52 in the direction of the arrow c (or the arrow b)).

Since the positions K, L, M and N in FIG. 4 are within an area enclosed by the retainer ring 18 on the polishing pad 16, and the polishing liquid does not easily run short compared to the case where the polishing liquid drops onto the polishing surface at the outside of the retainer ring 18.

For example, the polishing liquid which has been dropped at the positions K and L infiltrates between the semiconductor wafer 12 and the polishing pad 16 in the direction of the arrows a' with the movement of the polishing pad 16. The polishing liquid which has been dropped at the positions M and N and which has passed through the space between the semiconductor wafer 12 and the polishing pad 16 can be prevented from spilling to the outside because the polishing liquid is drawn toward the semiconductor wafer 12 from beneath the retainer ring 18 by the polishing liquid adjustment grooves 18B of the retainer ring 18 when the retainer ring 18 is rotating in the direction of the arrow c.

As stated above, the polishing liquid is dropped in the area enclosed by the retainer ring 18, and the polishing liquid can be prevented from spilling by the retainer ring 18. Thereby, the shortage of the polishing liquid can be prevented, and the polishing liquid can infiltrate to the center of the semiconductor wafer 12. In other words, the polishing liquid can be supplied to the whole surface of the semiconductor wafer 12.

Moreover, the surface of the polishing pad 16 is rubbed by the roughness formed on the contact surface 18A of the retainer ring 18 in FIG. 3, and the surface of the polishing pad 16 is washed with the polishing liquid at the same time. That is, the polishing of the semiconductor wafer 12 and the dressing of the polishing pad 16 are performed at the same time. Further, the polishing liquid is stirred to be uniform at the same time.

During the polishing and after the polishing, the retainer ring 18 may be rotated in the direction of the arrow b, so that the stagnant polishing liquid can be easily discharged. Thereby, the polish-dust and abrasive grains which clog up the pores on the polishing pad 16 can be discharged to the outside more efficiently.

In the polishing machine of this embodiment, the air is used as the pressure medium for regulating the internal pressure of the pressure chamber; however, the present invention should not be restricted to this. Other gases and liquids may be used as the pressure medium.

The roughness formed on the contact surface 18A of the retainer ring 18 in FIG. 3 does not always result from the knurling. It is no problem if the roughness has an effect of dressing the polishing pad.

Figure 5:
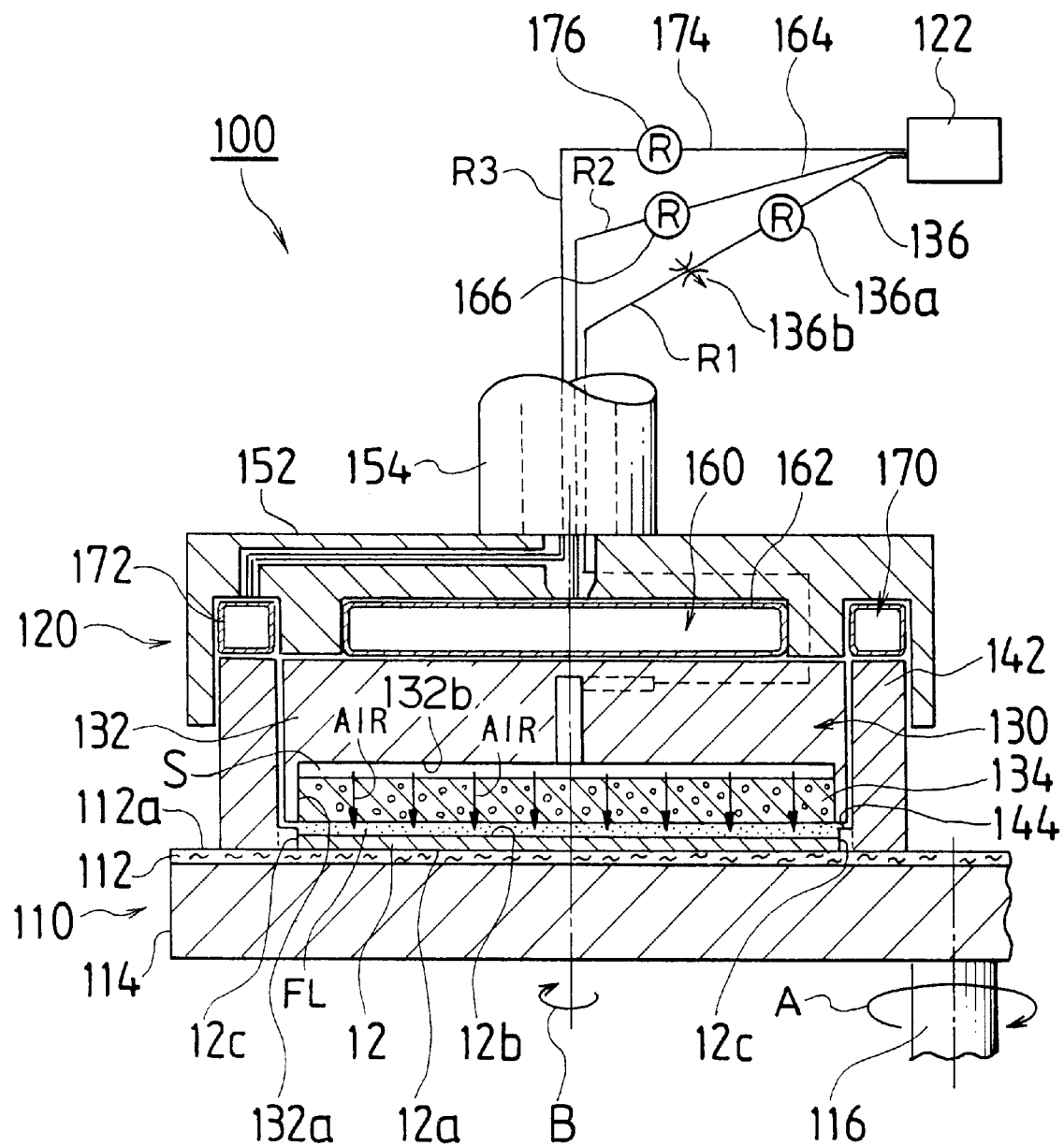
FIG. 5 is a sectional view illustrating the second embodiment for the polishing machine according to the present invention.

As shown in FIG. 5, a polishing machine 100 according to the second embodiment for the present invention consists of a polishing part 110, which polishes the semiconductor wafer 12 for example, and a holding and pressing part 120, which holds the semiconductor wafer 12 to press it against the polishing part 110 with a desired polishing pressure and rotates the semiconductor wafer 12.

The polishing part 110 consists of a polishing pad 112, which has a polishing surface 112a polishing the obverse side 12a of the semiconductor wafer 12; a turn table 114, which has the polishing pad 112 attached to the top thereof; and a driver 116, which rotates the turn table 114 in a horizontal polishing direction (the direction of an arrow A in the drawing) relatively to the holding and pressing part 120.

The holding and pressing part 120 consists of a pressing part 130, which forms a fluid layer FL pressing and coming in contact with the reverse side 12b of the semiconductor wafer 12; a cylindrical retainer ring 142, which encloses the pressing part 130 to press the polishing surface 112a of the polishing pad 112 around the semiconductor wafer 12; a holding part 144, which is integrated with the inner peripheral surface at the bottom of the retainer ring 142 to hold the circumferential surface 12c of the semiconductor wafer 12; a rotating support part 152, which is provided above the pressing part 130 and the retainer ring 142; a driver 154, which rotates the rotating support part 152; a polishing pressure regulating part 160, which is provided between the rotating support part 152 and the pressing part 130 and regulates pressure applied to the pressing part 130; and a retainer ring pressure regulating part 170, which is provided between the rotating support part 152 and the retainer ring 142 and presses the retainer ring 142 against the polishing pad 112 by a desired pressure.

The pressing part 130 consists of a base 132, which has a concave 132a opened toward the substantially whole surface of the reverse side 12b of the semiconductor wafer 12; a porous plate 134, which is breathable and arranged away from the reverse side 12b of the semiconductor wafer 12 and is fitted in the bottom end of the concave 132a; and an air supply mechanism 136 which supplies air to a space S between a ceiling 132b of the concave 132a and the porous plate 134.

The air supply mechanism 136 consists of an air compressor 122, an air pressure regulator 136a, which regulates the pressure of the compressed air, and an air flow regulator 136b, which regulates the flow of the compressed air. The air pressure regulator 136a and the air flow regulator 136b are provided on an air supply route R1 between the air compressor 122 and the concave 132a.

The porous plate 134 has a number of air passages therein, and, for example, it is made of a sintered ceramic material.

The polishing pressure regulating part 160 consists of a polishing pressure regulating bag 162, which is provided between the rotating support part 152 and the pressing part 130 and expands and contracts with the inflow and outflow of air, and an air supply mechanism 164 which supplies the air to the polishing pressure regulating bag 162. The air supply mechanism 164 consists of a common or separate air compressor 122, and an air pressure regulator 166 which is provided on an air supply route R2 between the air compressor 122 and the polishing pressure regulating bag 162 and regulates the pressure of the compressed air.

The retainer ring pressure regulating part 170 consists of a retainer ring pressure regulating bag 172, which is provided between the rotating support part 152 and the retainer ring 142 and expands and contracts with the inflow and outflow of air, and an air supply mechanism 174, which supplies the air to the retainer ring pressure regulating bag 172. The air supply mechanism 174 consists of a common or separate air compressor 122, and an air pressure regulator 176 which is provided on an air supply route R3 between the air compressor 122 and the retainer ring pressure regulating bag 172 and regulates the pressure of the compressed air.

Next, an explanation will be given about the method of polishing the semiconductor wafer 12 with the polishing machine 100.

First, the air supply mechanism 164 of the polishing pressure regulating part 160 regulates the air pressure in the bag 162, so that the pressure applied to the pressing part 130 can be regulated.

The air supply mechanism 136 supplies the air, whose flow and pressure have been regulated, to the space S between the ceiling 132b of the concave 132a and the porous plate 134. The air collects in the space S, so that the unevenness of the air pressure can be eliminated. Then, the air is gently supplied to the area between the porous plate 134 and the reverse side 12b of the semiconductor wafer 12 via the air passages in the porous plate 134 at a constant speed, thereby forming the fluid layer FL of the air, which applies the uniform polishing pressure on the whole surface of the reverse side 12b. The outflow quantity of the air, which forms the fluid layer FL, is equal to the inflow quantity thereof.

Figure 6:
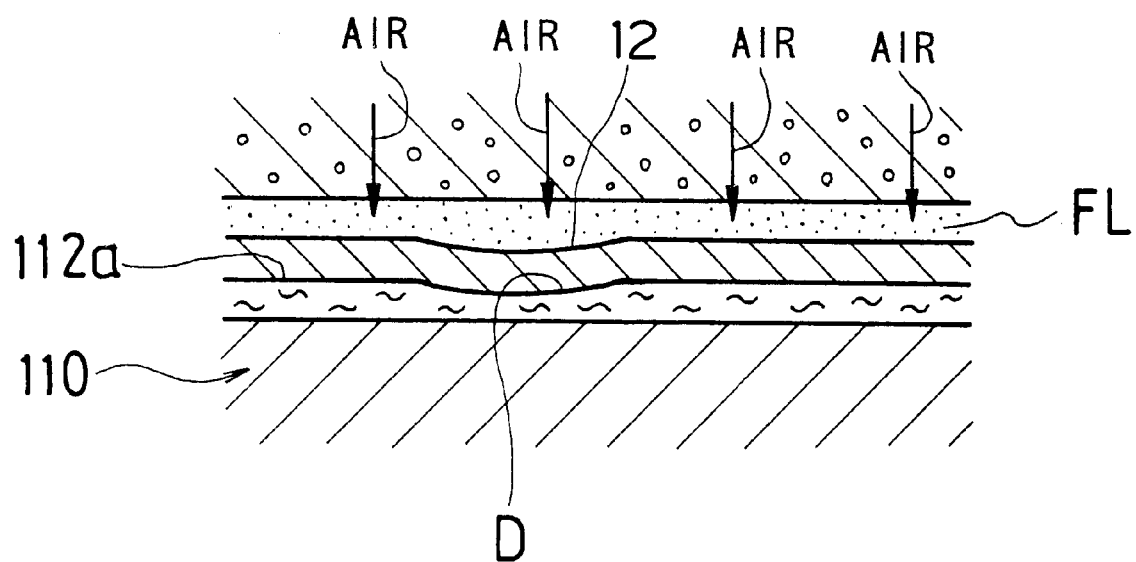
FIG. 6 is a view illustrating the deformation of the semiconductor wafer, which occurs with undulation of a polishing body in the polishing machine of FIG. 5.

For the reasons stated above, the fluid layer FL presses the whole surface of the reverse side 12b of the semiconductor wafer 12 regardless of the deformation of the semiconductor wafer 12. Thus, the semiconductor wafer 12 is pressed against the polishing surface 112a of the polishing part 110 by a desired polishing pressure in such a manner as to be fitted in undulations and depressions D on the polishing surface 112a as shown in FIG. 6. Moreover, the semiconductor wafer 12 is pressed against the polishing surface 112a by the uniform polishing pressure.

The retainer ring pressure regulating part 170 applies pressure to the retainer ring 142 so that the retainer ring 142 can press the polishing pad 112 by the desired pressure. Thereby, the polishing surface 112a at the edge of the semiconductor wafer 12 can be prevented from swelling up.

Since the retainer ring pressure regulating part 170 can regulate the pressure for the retainer ring to press the polishing pad 112, the polishing surface 112a at the edge of the semiconductor wafer 12 can be prevented from swelling up even if the polishing pressure is changed.

FIG. 7 is a view of assistance in explaining pressure which is applied to the semiconductor wafer 12 by the polishing pad 112 when the retainer ring 142 is pressed against the polishing surface 112a of the polishing pad 112. In an area L1 of the polishing pad 112 which area the retainer ring 142 presses, the pressure which is generated when the retainer ring 142 is pressed against the polishing surface 112a, is the maximum at the outer border of the retainer ring 142, and sharply decreases, and then gradually rises toward the inner periphery of the retainer ring 142.

In an area L2 which the semiconductor wafer 12 comes in contact, the pressure becomes uniform. Consequently, the pressure, which is applied to the semiconductor wafer 12 by the polishing pad 112, becomes uniform, and hence the semiconductor wafer 12 can be uniformly polished.

Further, the retainer ring pressure regulating part 170 can easily perform the control in such a state that a distance from the rotating support part 152 to the polishing surface 112a is fixed. If a controller (not shown) is used to control the retainer ring pressure regulating part 170, the construction of the controller can be simplified, and thus, response can be quick. Further, it is possible to eliminate errors in the regulation of the rotating support part 152, so that control errors can be reduced.

The driver 116 of the polishing part 110 is activated to rotate the polishing pad 112 as well as the turn table 114 in the horizontal polishing direction (the direction of the arrow A), and the driver 154 of the holding and pressing part 120 is activated to rotate in the direction of the arrow B. The semiconductor wafer 12 is polished in this manner.

Thus, the semiconductor wafer 12 is pressed against the polishing surface 112a in such a manner as to be fitted in the undulations and depressions D, and there is no swell of the polishing surface 112a at the edge of the semiconductor wafer 12. For this reason, the semiconductor wafer 12 can be uniformly polished.

The polishing machines 10 and 100 may be used to polish not only the semiconductor wafer 12 but also any type of wafer.

As set forth hereinabove, in the polishing machine of the present invention, the retainer ring controls the swell of the polishing surface at the edge of the wafer, and the polishing body applies the uniform pressure to the wafer, so that the wafer can be uniformly polished.

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. A wafer polishing machine comprising:

a wafer holding member for holding a wafer;

wafer holding member rotating means for rotating said wafer holding member;

a polishing body;

polishing body rotating means for rotating said polishing body;

a retainer ring attached to said wafer holding member to enclose said wafer, said retainer ring as well as said wafer contacting with said polishing body, a polishing liquid adjustment groove being formed on a face of said retainer ring extending from a radially inner side to a radially outer side of the retainer ring, said face contacting with said polishing body; and polishing liquid supply means connected to an external source of polishing liquid for supplying polishing liquid to a clearance area between said radially inner side of said retainer ring and the wafer and polishing body from above a lower surface of the retainer ring.

2. The wafer polishing machine as defined in claim 1, wherein a roughness for dressing said polishing body is formed on said face of said retainer ring.

3. A wafer polishing machine comprising:

a housing;

a wafer mount plate for holding a wafer, said wafer mount plate being loosely inserted into said housing;

housing rotating means for rotating said housing;

a polishing body;

polishing body rotating means for rotating said polishing body;

a retainer ring attached to said housing to enclose said wafer, said retainer ring as well as said wafer contacting with said polishing body, a polishing liquid adjustment groove being formed on a face of said retainer ring extending from a radially inner side to a radially outer side of the retainer ring, said face contacting with said polishing body; and polishing liquid supply means connected to an external source of polishing liquid for supply polishing liquid to a clearance are between said radially inner side of said retainer ring and the wafer and polishing body from above a lower surface of the retainer ring;

a pressure chamber for applying pressure on said wafer mount plate to press said wafer against said polishing body, said pressure chamber being arranged between said housing and said wafer mount plate, internal pressure of said pressure chamber being adjustable; and control means for controlling relative positions of said wafer and said retainer ring by regulating the internal pressure of said pressure chamber.

4. The wafer polishing machine as defined in claim 3, wherein an roughness for dressing said polishing body is formed on said face of said retainer ring.

5. A wafer polishing machine comprising:

a wafer holding member for holding a wafer;

wafer holding member rotating means for rotating said wafer holding member;

a polishing body;

polishing body rotating means for rotating said polishing body;

a retainer ring attached to said wafer holding member to enclose said wafer, said retainer ring as well as said wafer contacting with said polishing body; and polishing liquid supply means for supplying polishing liquid to a clearance area between a radially inner side of the retainer ring and the wafer and polishing body from above a lower surface of the retainer ring, said clearance area supplying the polishing liquid to an area between said wafer and said polishing body.

* * * * *